United States Patent [19]

La Roche et al.

[11] Patent Number: 5,841,071
[45] Date of Patent: Nov. 24, 1998

[54] ELECTRICAL CONDUCTOR FOR A SPACECRAFT SOLAR GENERATOR

[75] Inventors: Guenther La Roche, Ottobrunn; Christiane Oxynos-Lauschke, Unterhaching, both of Germany

[73] Assignee: Daimler-Benz Aerospace AG, Germany

[21] Appl. No.: 567,329

[22] Filed: Dec. 5, 1995

[30] Foreign Application Priority Data

Dec. 5, 1994 [DE] Germany ............... 44 43 217.8

[51] Int. Cl.⁶ ............... H01R 4/00; C22C 5/02
[52] U.S. Cl. ............... 174/94 R; 420/508; 420/511
[58] Field of Search ............... 174/94 R; 228/4.5; 29/843, 860; 439/885, 886, 887; 219/56.21, 56.1; 420/508, 511; 428/606, 620

[56] References Cited

U.S. PATENT DOCUMENTS

| | | | |
|---|---|---|---|
| 3,973,996 | 8/1976 | Kennedy | ............... 136/206 |
| 4,080,485 | 3/1978 | Bonkohara | ............... 428/620 X |
| 4,330,329 | 5/1982 | Hayashi et al. | ............... 420/511 X |
| 4,752,442 | 6/1988 | Asada et al. | ............... 420/507 X |
| 5,364,706 | 11/1994 | Toyofuku et al. | ............... 428/607 X |
| 5,441,690 | 8/1995 | Ayala-Esquilin et al. | ............... 264/277 X |

FOREIGN PATENT DOCUMENTS 3537262   4/1987   Germany .

*Primary Examiner*—Bot L. Ledynh
*Assistant Examiner*—Chau N. Nguyen
*Attorney, Agent, or Firm*—Evenson, McKeown, Edwards & Lenahan, P.L.L.C.

[57] ABSTRACT

An electrical conductor for a spacecraft solar generator with at least one solar module, wherein the electrical conductor is made of an alloy containing gold and traces of at least one of silver, palladium or copper and which can be used as a solar cell connector. The electrical conductor advantageously cannot be oxidized by atomic oxygen, has a high hardness and elasticity and can thus withstand high thermal stresses. Furthermore, the electrical conductor can be processed by resistance welding without damaging the cell.

3 Claims, No Drawings

ELECTRICAL CONDUCTOR FOR A SPACECRAFT SOLAR GENERATOR

BACKGROUND AND SUMMARY OF THE INVENTION

The present invention relates to an electrical conductor containing gold for spacecraft solar generators comprising at least one solar module.

Electrical conductors of this type are used primarily as solar cell connectors. Spacecraft solar generators consist mainly of a plurality of panels that can be folded and unfolded, or mounted on satellites, each of which support one or more solar cell modules, which in turn consist of a plurality of individual solar cells wired together in series and/or in parallel. In the case of a series circuit, where the front contact of a solar cell is connected with the rear contact of the next solar cell in line, this wiring can be done by using solar cell connectors. In the case of a parallel circuit, the front and rear contacts of adjacent solar cells are connected separately with one another by solar cell connectors.

When solar generators are used on spacecrafts, special material and design requirements are imposed. Solar generators for space applications, especially for use on earth satellites, are exposed to changing thermal conditions as a result of alternating light and shadow phases. As a result, these solar generator modules are subjected not only to thermally induced stresses, but also to mechanical fatigue, depending on the frequency of the thermal cycles. A typical thermal cycle for a geostationary orbit (GEO) is 92 cycles per year between +60° and −170° C. and a typical thermal cycle for a lower earth orbit (LEO) is 5000 cycles per year between +100° and −100° C. Therefore, solar generator modules must be suitably designed and adapted to withstand these thermal stresses.

Carbon-fiber-bonded materials with low thermal expansion coefficients are used as supporting structures for solar cells wherein the solar cell connectors are welded to the contacts on the solar cells, which consist primarily of silver. As such, silver has been found to be an especially suitable connector material for solar cells. Traditionally, most such connectors consist of either silver mesh or silver foil. In order to withstand thermal stresses, the materials used must be rolled hard and as thin as possible (15 μm for example). Compensation for thermal stress must be provided in the form of a stress relief loop that is in the plane or projects out of the plane. The geometry of the stress relief loop is determined by recording the Wöhler curve. A minimum height of 0.4 mm and a loop radius of at least 0.1 mm are typical for an arch that projects out of the plane. Furthermore, in order for the shape of the stress relief loop to remain stable throughout manufacturing, testing, and mission phases, the material is also required to have a minimum hardness and elasticity.

When solar generators were first used in space, the solar cells were initially soldered to the connectors. As a result, the cell contacts were thickened in such a way that, thermally speaking, they were independent and frequently, the cell contacts or soldered points came loose because of unmatched thermal expansion coefficients. Therefore, the need arose for a material with a thermal expansion coefficient similar to that of solar cells. Molybdenum or invar was developed for use in the popular silicon cell. Both are well-suited for soldering, but are not suitable for welding because their melting points are different from that of the silver contacts on the solar cells.

However, because of the extreme requirements imposed in space, welding is a far better method than soldering for making a permanent electrical contact. German Patent Application No. DE 3,537,262 discloses a method of coating molybdenum and invar connectors with silver and then welding this coating to the silver contacts on the solar cells. As such, solar cell connectors made of silver foil or molybdenum respectively invar coated with silver are preferred. As far as fatigue resistance is concerned, both types of connectors are adequate. Molybdenum has favorable material properties, especially with respect to its tensile strength and thermal expansion coefficient. Silver is desirable because of its high electrical conductivity, which permit the manufacture of solar cell connectors with limited thickness (approximately 12.5 μm).

This type of solar cell connector has proven to be reliable in geostationary satellites. However, low earth orbiting satellites with an altitude of up to 800 km, are affected by atomic oxygen as well as the more rapid sequence of thermal cycles. Silver is especially affected because it oxidizes. The oxide layers formed on the silver, flake off under the cyclic thermal stresses and then new surfaces are exposed to oxidation. In solar cell connectors based on molybdenum, only the silver coating is attacked as molybdenum is largely resistant to atomic oxygen. In order to avoid any flaking of the silver oxide, molybdenum connectors have been developed that are coated with silver only on their welded points. However, at least as far as cost is concerned, this solution is not very satisfactory.

Electrical conductors for solar cells are disclosed in U.S. Pat. No. 3,973,996 (the '996 patent). According to the '996 patent, solar cells wired in series are mounted on a common, flexible, electrically non-conducting substrate. The solar cells have a metallic coating, composed of gold for example, on the side facing the substrate. Opposite this coating, on the substrate, is a copper layer covered with gold for example. The solar cell is bonded to the substrate by diffusion welding at an elevated temperature, of about 280° C. for example. The copper layer covered with gold projects on one side of the solar cell and serves as an electrical connection to the adjacent cell. A separate connector of unspecified composition is used for the electrical connection, which can also be connected by diffusion welding to the laterally projecting part of the copper layer covered with gold. It would also appear to be advantageous to coat these connectors with gold because then the diffusion welding is easier. In any event, the '996 patent discloses an electrical conductor consisting partly of gold, and more specifically, a solar cell connector. The gold coating in the '996 patent simplifies the diffusion welding process and does not protect the material underneath (copper for example) from microcrack formation caused by atomic oxygen.

In any case, resistance welding is preferred over diffusion welding because it makes more reliable and more permanent electrical as well as mechanical connections of the type required for use in spacecrafts. Resistance welding permits the use of higher welding temperatures which in turn leads to improved bonding of the parts to be connected as well as a reduction of the welding time. The latter aspect is important because when welding a solar cell connector to the surface contact of a solar cell, shorter welding times sharply reduce or largely avoid the harmful diffusion of gold atoms through the cell contacts into the semiconductor material of a solar cell.

Another important aspect, especially with solar cell connectors for spacecraft solar generators, consists of the fact that the connectors must be sufficiently hard and elastic. Solar connectors for spacecraft solar generators are frequently provided with thermal equalizing loops which must be able to withstand the mechanical stresses during processing and eventually the high thermal stresses of space without changing their shape.

A goal of the present invention is to provide an electrical conductor, especially a solar cell connector, which cannot be oxidized by atomic oxygen, has a high hardness and elasticity and thus can withstand high thermal stresses. Another goal of the present invention is to provide an electrical conductor, especially a solar cell connector, which can be processed by resistance welding without damaging the cell.

These goals are achieved according to the present invention by providing an electrical conductor consisting of an alloy which, in addition to gold, contains traces of silver and/or palladium and/or copper.

The present invention, therefore, provides a homogeneous material in the form of an alloy consisting primarily of gold, but also containing as important components critical to achieving the desired properties, traces of silver, palladium, and/or copper. Contrary to the prior art, no laminated structure is provided wherein gold is only used as a thin surface layer. According to the present invention, the use of gold containing traces of certain specific substances produces the above listed advantages which far outweigh the relatively high cost of the materials.

The electrical conductors according to the present invention are particularly useful, as already mentioned above, as solar cell connectors. However, the electrical conductors of the present invention can also be used in the form of other solar cell current carrying components such as for example, solar module terminal connectors, cables, stranded conductors, or busbars.

DETAILED DESCRIPTION OF THE INVENTION

When electrical conductors according to the present invention are used as solar cell connectors, traces of silver, palladium and copper are preferably added to the gold alloy. However, the percentage of silver, palladium and copper should together amount to no more than about 0.1 wt. %.

One material which has proven to be especially advantageous in practicing the invention, is manufactured by the Heraeus Company and contains more than 99.98 wt. % gold as well as 45 ppm silver, 38 ppm palladium, and 12 ppm copper (Heraeus type 2545). This material exhibits the properties required by the present invention with a high degree of reliability. The performance of 50,000 thermal cycles between −110° and +110° C. representing 10 years of operation in an earth orbit at an altitude of 500 km during tests conducted in evaluating the invention has shown that the desired properties are stable within the narrow admissible limits. Thus, no degradation whatsoever of the electrical properties was detected in excess of the limits of measurement accuracy.

The tests were conducted on crystalline silicon solar cells with contacts composed primarily of silver. After a short testing period, it was also possible to establish welding times at which it was guaranteed that no gold could diffuse through the electrode layer of the solar cells into the semiconductor material. For example, a typical value for the welding time was 30 ms and a typical value for the welding current was 240 A. It turned out that the welding time should at most be about 50 ms and the welding current should at most be about 400 A. Furthermore, the tensile strength of the solar cell connectors should be at a minimum of about 200 N/mm$^2$ because of the minimum hardness required of the gold alloy. The thickness of the stripshaped material should be a maximum of about 15 $\mu$m and preferably 12.5 $\mu$m because of the desirable fatigue resistance.

Although the invention has been described and illustrated in detail, it is to be clearly understood that the same is by way of illustration and example, and is not to be taken by way of limitation. The spirit and scope of the present invention are to be limited only by the terms of the appended claims.

We claim:

1. An electrical solar cell connector for a spacecraft solar generator comprising at least one solar module, wherein the electrical solar cell connector consists of an alloy containing gold and no more than about 0.1 wt. % of at least one member selected from the group consisting of silver, palladium, and copper.

2. A spacecraft electrical solar cell connector for a spacecraft solar generator, wherein the electrical solar cell connector consists of an alloy containing gold and no more than about 0.1 wt. % of at least one member selected from the group consisting of silver, palladium, and copper.

3. A spacecraft solar generator having an electrical solar cell connector which consists of an alloy containing gold and no more than about 0.1 wt. % of at least one member selected from the group consisting of silver, palladium, and copper.

* * * * *